(12) United States Patent
Ellis et al.

(10) Patent No.: US 9,715,939 B2
(45) Date of Patent: Jul. 25, 2017

(54) LOW READ DATA STORAGE MANAGEMENT

(71) Applicant: SanDisk Technologies LLC, Plano, TX (US)

(72) Inventors: Robert W. Ellis, Phoenix, AZ (US); James M. Higgins, Chandler, AZ (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/925,945

(22) Filed: Oct. 28, 2015

(65) Prior Publication Data

US 2017/0047124 A1    Feb. 16, 2017

Related U.S. Application Data

(60) Provisional application No. 62/203,302, filed on Aug. 10, 2015.

(51) Int. Cl.
*G11C 11/34* (2006.01)
*G11C 16/04* (2006.01)
(Continued)

(52) U.S. Cl.
CPC .......... *G11C 16/3459* (2013.01); *G06F 3/065* (2013.01); *G06F 3/0619* (2013.01);
(Continued)

(58) Field of Classification Search
CPC ... G11C 16/3459; G11C 16/10; G06F 3/0619; G06F 3/065; G06F 3/0688; G06F 3/0622; G06F 3/0685; G06F 3/0637
See application file for complete search history.

(56) References Cited

U.S. PATENT DOCUMENTS 4,586,167 A    4/1986 Fujishima et al.
5,559,988 A    9/1996 Durante et al.
(Continued)

FOREIGN PATENT DOCUMENTS

EP    0 376 285 A2    7/1990
WO    WO 2012/083308    6/2012

OTHER PUBLICATIONS

Seagate Technology, "SSCI Commands Reference Manual, Rev. C", Product Manual dated Apr. 2010, pp. 211-214.
(Continued)

*Primary Examiner* — Toan Le
(74) *Attorney, Agent, or Firm* — Morgan, Lewis & Bockius LLP

(57) ABSTRACT

Systems and methods disclosed herein are used to efficiently manage low read data. In one aspect, a method includes, in response to detecting occurrence of a first event (e.g., PFail), writing low read data to non-volatile memory of a storage device with a fast SLC programming mode, distinct from a default SLC programming mode. Writing the low read data with the fast SLC programming mode: (i) includes using one or more memory programming parameters distinct from a default set of memory programming parameters used for writing data with the default SLC programming mode and (ii) takes less time per predefined unit of data than writing data with the default SLC programming mode. The method also includes: in response to detecting occurrence of a second event (e.g., host write command), writing data corresponding to the second event with the default SLC programming mode using the default set of memory programming parameters.

19 Claims, 6 Drawing Sheets

(51) Int. Cl.
  *G11C 16/34* (2006.01)
  *G06F 3/06* (2006.01)
  *G11C 16/10* (2006.01)

(52) U.S. Cl.
  CPC .......... *G06F 3/0622* (2013.01); *G06F 3/0637* (2013.01); *G06F 3/0685* (2013.01); *G06F 3/0688* (2013.01); *G11C 16/10* (2013.01); *G11C 16/349* (2013.01)

(56) References Cited

U.S. PATENT DOCUMENTS

| | | | |
|---|---|---|---|
| 5,909,559 | A | 6/1999 | So |
| 6,247,136 | B1 | 6/2001 | MacWilliams et al. |
| 6,292,410 | B1 | 9/2001 | Yi et al. |
| 6,401,213 | B1 | 6/2002 | Jeddeloh |
| 6,449,709 | B1 | 9/2002 | Gates |
| 7,969,809 | B2 | 6/2011 | Ben-Rubi |
| 8,010,738 | B1 | 8/2011 | Chilton et al. |
| 8,122,202 | B2 | 2/2012 | Gillingham |
| 8,213,255 | B2 | 7/2012 | Hemink et al. |
| 8,255,618 | B1 | 8/2012 | Borchers et al. |
| 8,321,627 | B1 | 11/2012 | Norrie et al. |
| 8,429,498 | B1 | 4/2013 | Anholt et al. |
| 8,479,080 | B1 | 7/2013 | Shalvi et al. |
| 8,539,139 | B1 | 9/2013 | Morris |
| 8,595,590 | B1 | 11/2013 | Vojcic et al. |
| 8,775,720 | B1 | 7/2014 | Meyer et al. |
| 8,825,967 | B2 | 9/2014 | Hong Beom |
| 8,874,836 | B1 | 10/2014 | Hayes et al. |
| 8,886,872 | B1 | 11/2014 | Norrie |
| 8,924,661 | B1 | 12/2014 | Shachar et al. |
| 8,984,376 | B1 | 3/2015 | Norrie |
| 9,128,825 | B1 | 9/2015 | Albrecht et al. |
| 9,170,876 | B1 | 10/2015 | Bates et al. |
| 9,176,971 | B2 | 11/2015 | Shapiro |
| 9,214,965 | B2 | 12/2015 | Fitzpatrick et al. |
| 2003/0115403 | A1 | 6/2003 | Bouchard et al. |
| 2003/0122834 | A1 | 7/2003 | Mastronarde et al. |
| 2004/0117441 | A1 | 6/2004 | Liu et al. |
| 2005/0144361 | A1 | 6/2005 | Gonzalez et al. |
| 2005/0248992 | A1 | 11/2005 | Hwang et al. |
| 2007/0002629 | A1 | 1/2007 | Lee et al. |
| 2007/0156998 | A1 | 7/2007 | Gorobets |
| 2007/0233937 | A1 | 10/2007 | Coulson et al. |
| 2008/0140914 | A1 | 6/2008 | Jeon |
| 2008/0147994 | A1 | 6/2008 | Jeong et al. |
| 2008/0235466 | A1 | 9/2008 | Traister |
| 2008/0235480 | A1 | 9/2008 | Traister |
| 2008/0295094 | A1 | 11/2008 | Korupolu et al. |
| 2009/0168525 | A1 | 7/2009 | Olbrich et al. |
| 2009/0177943 | A1 | 7/2009 | Silvus et al. |
| 2009/0222627 | A1 | 9/2009 | Reid |
| 2009/0282191 | A1 | 11/2009 | Depta |
| 2010/0005217 | A1 | 1/2010 | Jeddeloh |
| 2010/0014364 | A1 | 1/2010 | Laberge et al. |
| 2010/0082879 | A1 | 4/2010 | McKean et al. |
| 2010/0165730 | A1 | 7/2010 | Sommer et al. |
| 2010/0174845 | A1 | 7/2010 | Gorobets et al. |
| 2010/0174853 | A1 | 7/2010 | Lee et al. |
| 2010/0220509 | A1 | 9/2010 | Sokolov et al. |
| 2010/0250874 | A1 | 9/2010 | Farrell et al. |
| 2011/0113204 | A1 | 5/2011 | Henriksson et al. |
| 2011/0138100 | A1 | 6/2011 | Sinclair |
| 2011/0235434 | A1 | 9/2011 | Byom et al. |
| 2011/0252215 | A1 | 10/2011 | Franceschini et al. |
| 2011/0264851 | A1 | 10/2011 | Jeon et al. |
| 2011/0302474 | A1 | 12/2011 | Goss et al. |
| 2012/0030408 | A1 | 2/2012 | Flynn et al. |
| 2012/0047317 | A1 | 2/2012 | Yoon et al. |
| 2012/0159070 | A1 | 6/2012 | Baderdinni et al. |
| 2012/0198129 | A1 | 8/2012 | Van Aken et al. |
| 2012/0224425 | A1 | 9/2012 | Fai et al. |
| 2012/0278530 | A1 | 11/2012 | Ebsen |
| 2012/0324180 | A1 | 12/2012 | Asnaashari et al. |
| 2013/0007380 | A1 | 1/2013 | Seekins et al. |
| 2013/0070507 | A1 | 3/2013 | Yoon |
| 2013/0111112 | A1 | 5/2013 | Jeong et al. |
| 2013/0111289 | A1 | 5/2013 | Zhang et al. |
| 2013/0111290 | A1 | 5/2013 | Zhang et al. |
| 2013/0132650 | A1 | 5/2013 | Choi et al. |
| 2013/0182506 | A1* | 7/2013 | Melik-Martirosian G11C 16/10 365/185.18 |
| 2013/0219106 | A1 | 8/2013 | Vogan et al. |
| 2013/0232290 | A1 | 9/2013 | Ish et al. |
| 2013/0254498 | A1 | 9/2013 | Adachi et al. |
| 2013/0262745 | A1 | 10/2013 | Lin et al. |
| 2013/0297894 | A1 | 11/2013 | Cohen et al. |
| 2013/0346805 | A1 | 12/2013 | Sprouse et al. |
| 2014/0006688 | A1 | 1/2014 | Yu et al. |
| 2014/0013026 | A1 | 1/2014 | Venkata et al. |
| 2014/0047170 | A1 | 2/2014 | Cohen et al. |
| 2014/0075100 | A1 | 3/2014 | Kaneko et al. |
| 2014/0143637 | A1 | 5/2014 | Cohen et al. |
| 2014/0173239 | A1 | 6/2014 | Schushan |
| 2014/0229655 | A1 | 8/2014 | Goss et al. |
| 2014/0229656 | A1 | 8/2014 | Goss et al. |
| 2014/0241071 | A1 | 8/2014 | Goss et al. |
| 2014/0244897 | A1 | 8/2014 | Goss et al. |
| 2014/0244899 | A1 | 8/2014 | Schmier et al. |
| 2014/0258598 | A1 | 9/2014 | Canepa et al. |
| 2014/0281833 | A1 | 9/2014 | Kroeger et al. |
| 2014/0310241 | A1 | 10/2014 | Goyen |
| 2014/0379988 | A1 | 12/2014 | Lyakhovitskiy et al. |
| 2015/0067172 | A1 | 3/2015 | Ashokan et al. |
| 2015/0074487 | A1 | 3/2015 | Patapoutian et al. |
| 2015/0095558 | A1* | 4/2015 | Kim .................. G06F 12/0246 711/103 |
| 2015/0113206 | A1 | 4/2015 | Fitzpatrick et al. |
| 2015/0186278 | A1 | 7/2015 | Jayakumar et al. |
| 2015/0234612 | A1 | 8/2015 | Himelstein et al. |
| 2015/0261473 | A1 | 9/2015 | Matsuyama et al. |
| 2015/0262632 | A1 | 9/2015 | Shelton et al. |
| 2015/0301749 | A1 | 10/2015 | Seo et al. |
| 2015/0331627 | A1* | 11/2015 | Kwak .................. G06F 3/0619 711/103 |
| 2016/0026386 | A1 | 1/2016 | Ellis et al. |
| 2016/0034194 | A1 | 2/2016 | Brokhman et al. |
| 2016/0062699 | A1 | 3/2016 | Samuels et al. |
| 2016/0070493 | A1* | 3/2016 | Oh ........................ G06F 3/0622 711/103 |
| 2016/0071612 | A1 | 3/2016 | Takizawa et al. |
| 2016/0117099 | A1 | 4/2016 | Prins et al. |
| 2016/0117102 | A1 | 4/2016 | Hong et al. |
| 2016/0117105 | A1 | 4/2016 | Thangaraj et al. |
| 2016/0117252 | A1 | 4/2016 | Thangaraj et al. |
| 2016/0170671 | A1* | 6/2016 | Huang .................. G06F 3/0619 711/103 |
| 2016/0170831 | A1 | 6/2016 | Lesartre et al. |
| 2016/0179403 | A1* | 6/2016 | Kurotsuchi ........... G06F 3/0617 711/114 |
| 2016/0210060 | A1 | 7/2016 | Dreyer |
| 2016/0299689 | A1 | 10/2016 | Kim et al. |
| 2016/0299699 | A1 | 10/2016 | Vanaraj et al. |
| 2016/0299704 | A1 | 10/2016 | Vanaraj et al. |
| 2016/0299724 | A1 | 10/2016 | Vanaraj et al. |
| 2016/0342344 | A1 | 11/2016 | Kankani et al. |
| 2016/0342345 | A1 | 11/2016 | Kankani et al. |
| 2016/0371394 | A1 | 12/2016 | Shahidi et al. |

OTHER PUBLICATIONS

International Search Report and Written Opinion dated Nov. 18, 2015, received in International Patent Application No. PCT/US2015/039552 which corresponds to U.S. Appl. No. 14/559,183, 11 pages (Ellis).

International Search Report and Written Opinion dated Jul. 4, 2016, received in International Patent Application No. PCT/US2016/028477, which corresponds to U.S. Appl. No. 14/883,540, 11 pages (Hodgdon).

International Search Report and Written Opinion dated Nov. 9, 2015, received in International Patent Application No. PCT/

(56) References Cited

OTHER PUBLICATIONS

US2015/053551, which corresponds to U.S. Appl. No. 14/668,690, 12 pages (Thangaraj).
International Search Report and Written Opinion dated Nov. 11, 2015, received in International Patent Application No. PCT/US2015/053582, which corresponds to U.S. Appl. No. 14/659,493, 12 pages (Prins).
International Search Report and Written Opinion dated Sep. 8, 2016, received in International Patent Application No. PCT/US2016/036716, which corresponds to U.S. Appl. No. 14/925,945, 13 pages (Ellis).
Atmel Data-sheet, "9-to-bit Selectable, ±0.5° C Accurate Digital Temperature Sensor with Nonvolatile Registers and Serial EEPROM" www.atmel.com/images/Atmel-8854-DTS-AT30TSE752A-754A-758A-Datasheet.pdf, Atmel Data-sheet, Mar 1, 2011,—Atmel-8854-DTS-AT30TSE752A-754A-758A-Datasheet_102014, 57 pages.
Tanenbaum, "Structured Computer Organization", 3rd edition 1990, section 1.4, p. 11, 3 pages.

* cited by examiner

LOW READ DATA STORAGE MANAGEMENT

RELATED APPLICATIONS

This application claims priority to U.S. Provisional Patent Application No. 62/203,302, filed Aug. 10, 2015, which is incorporated by reference in its entirety.

TECHNICAL FIELD

The disclosed embodiments relate generally to command processing in a storage device (e.g., a device including one or more persistent memory devices, for example flash memory devices), and in particular, to efficiently managing and maintaining data that is rarely read, sometimes called low read data.

BACKGROUND

Semiconductor memory devices, including persistent memory devices such as flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, persistent or non-volatile memory (e.g., flash memory, as well as other types of non-volatile memory implemented using any of a variety of technologies) retains stored information even without power, as opposed to volatile memory, which requires power to maintain the stored information.

Particular types of data written to persistent or non-volatile memory, such as error log data, power fail data, and logical-to-physical mapping tables are read back only a limited number of times (e.g., less than a dozen times). Nevertheless, persistent or non-volatile memory systems, such as flash memory systems, typically store these particular types of data in the same fashion (e.g., with write operations designed for high endurance) as data that is read back repeatedly (e.g., thousands of times).

SUMMARY

Without limiting the scope of the appended claims, after considering this disclosure, and particularly after considering the section entitled "Detailed Description" one will understand how the aspects of various embodiments are implemented and used to write "low read data" in an optimized and efficient manner, in order to quickly write low read data with an appropriate level of endurance given that the low read data will be read back at most a limited number of times. More specifically, the disclosed embodiments write low read data in a way that sacrifices read disturb performance in order to achieve faster write times. For example, the embodiments disclosed herein help to ensure that low read data is written quickly (and in a way that requires less power as compared to write operations during normal operation of the storage device) when there is a power failure that affects a flash memory device. Moreover, the embodiments disclosed herein also reduce write times for background write operations (e.g., logical-to-physical mapping table and associated logging data), which helps storage devices meet quality-of-service metrics (e.g., storage devices are able to achieve reduced read latencies because the background write operations execute more quickly and, therefore, do not impact (or have less of an impact on) the time required to perform a read operation). In this way, storage devices that take advantage of the disclosed embodiments may achieve increased drive endurance as whole, due to the lower programming requirements for a subset of data written to the storage device (e.g., low read data).

In some embodiments, in order to achieve the improvements discussed above, when a storage device detects occurrence of a first event (e.g., a power fail event), the storage device writes low read data to non-volatile memory of the storage device with a fast SLC programming mode of writing the low read data. Writing the low read data with the fast SLC programming mode includes using one or more memory programming parameters to write data faster (e.g., faster on a per page or per block basis) than writing data to the non-volatile memory of the storage device with a default SLC programming mode that uses a default set of memory programming parameters. By using the fast SLC programming mode, low read data is written quickly and requires less power than data written using the default SLC programming mode.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

Figure 1:
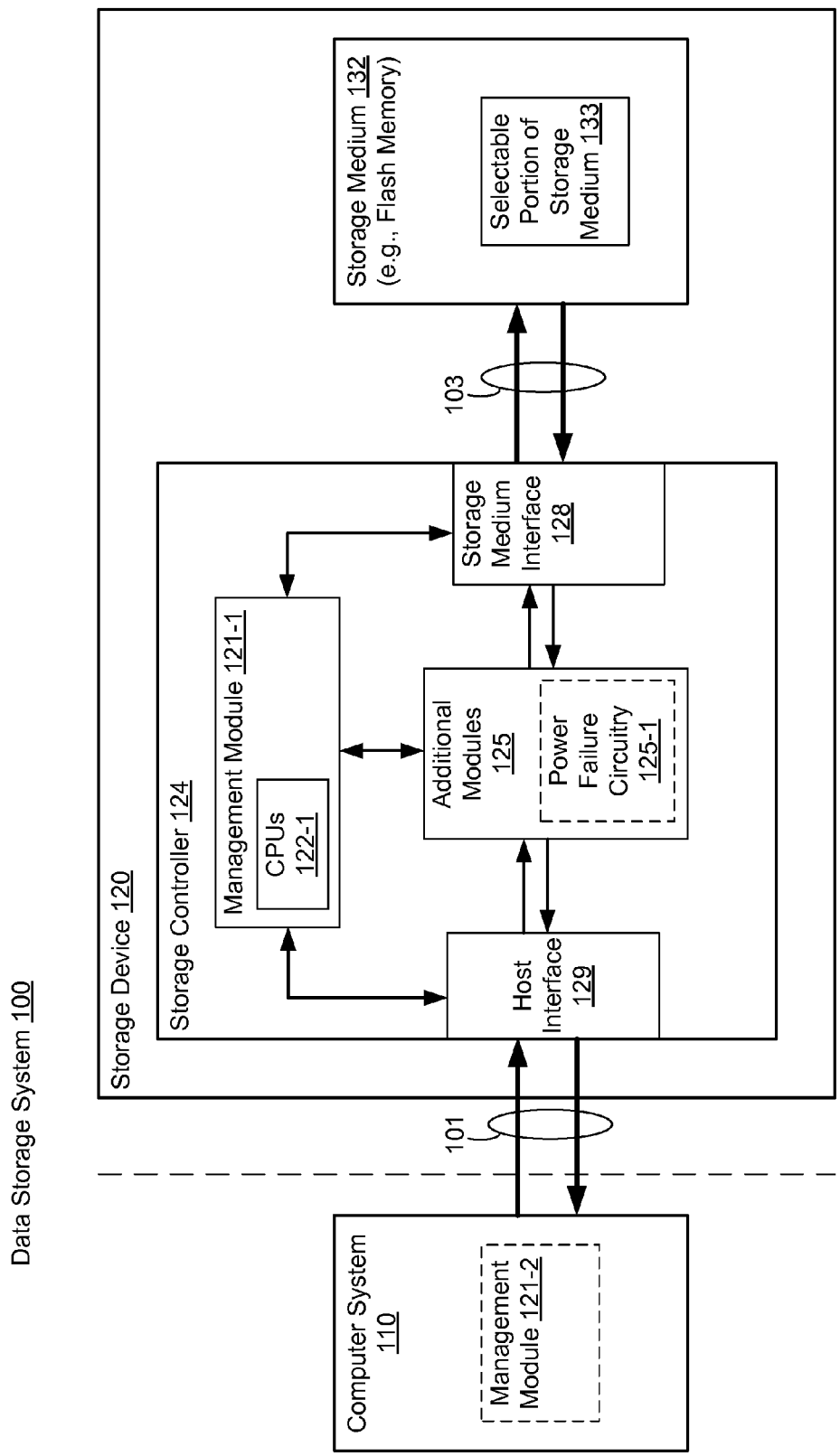
FIG. 1 is a block diagram illustrating an implementation of a data storage system, in accordance with some embodiments.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Particular types of data written to flash memory, such as error log data, power fail data, and logical-to-physical log data is read back only a limited number of times (e.g., once or twice). Conventional flash memory systems store these particular types of data in the same fashion (e.g., with write operations designed for high endurance) as data that is read back repeatedly (e.g., thousands of times). Consequently, what is desired are mechanisms for managing low read data within a storage device (e.g., a persistent or non-volatile storage device, such as a flash memory device), in order to write data with an appropriate level of endurance based on the type of data being written and the type of programming mode used to write the data. This need is particular acute for low read data.

The various embodiments described herein include systems, methods, and/or devices used to efficiently manage low read data within a storage device that includes persistent or non-volatile memory ("NVM"). In one aspect, the method includes using a fast SLC programming mode for writing data having a low read requirement and using a default SLC programming mode for writing data that does not have a low read requirement. The fast SLC programming mode takes less time (e.g., 40% less time) per predefined unit of data (e.g., per block) than writing data with the default SLC programming mode.

(A1) More specifically, some embodiments include a method of managing a storage device that includes non-volatile memory. The method includes: detecting occurrence of a first event (e.g., detecting a power failure). In response to detecting the occurrence of the first event, the method further includes: writing low read data (e.g., data satisfying predefined low read criteria) to the non-volatile memory of the storage device with a fast SLC programming mode, distinct from a default SLC programming mode. Writing data with the fast SLC programming mode includes writing the low read data using one or more memory programming parameters distinct from a default set of memory programming parameters used for writing data to the non-volatile memory of the storage device with the default SLC programming mode. Also, writing data to the non-volatile memory of the storage device with the fast SLC programming mode takes less time per predefined unit of data than writing data to the non-volatile memory of the storage device with the default SLC programming mode. The method further includes: detecting occurrence of a second event (e.g., a host write command or garbage collection write command). In response to detecting the occurrence of the second event, the method includes: writing data corresponding to the second event to the non-volatile memory of the storage device with the default SLC programming mode, wherein writing data with the default SLC programming mode includes writing data using the default set of memory programming parameters. In some embodiments, memory programming parameters are more broadly referred to as memory operation parameters and the memory operation parameters include both memory programming parameters (e.g., voltages used for electrical pulses used to execute a particular write command) used in conjunction with write commands and memory reading parameters used in conjunction with read commands (e.g., reading thresholds for completing a particular read command).

(A2) In some embodiments of the method of A1, writing data to the non-volatile memory of the storage device with the fast SLC programming mode takes at least 40% less time per predefined unit of data as compared to writing data to the non-volatile memory of the storage device with the default SLC programming mode.

(A3) In some embodiments of the method of any one of A1-A2, writing data with the fast SLC programming mode includes a memory programming operation with a plurality of electrical pulses, and the one or more memory programming parameters used for writing data with the fast SLC programming mode include one or more parameters selected from the group consisting of: a clock rate or programming pulse duration, a maximum number of electrical pulses used in the memory programming operation, a first voltage for a first electrical pulse or first set of electric pulses of the plurality of electrical pulses, a write verification control parameter, and a delta voltage corresponding to a difference between a second voltage, for a second electrical pulse or second set of electrical pulses of the plurality of electrical pulses, and the first voltage.

(A4) In some embodiments of the method of A3, the clock rate or programming pulse duration used in the fast SLC programming mode is less than the clock rate or programming pulse duration used in the default SLC programming mode.

(A5) In some embodiments of the method of any one of A3-A4, the number of electrical pulses within the plurality of electrical pulses is lower than a default number of electrical pulses within a default plurality of electrical pulses.

(A6) In some embodiments of the method of A5, the first voltage for the first electrical pulse or first set of electrical pulses is greater than a default voltage for each electrical pulse within the default plurality of electrical pulses.

(A7) In some embodiments of the method of any one of A1-A6, the first event is a power failure event, a scheduled write event for copying at least a portion of a mapping table to the non-volatile memory of the storage device, an event indicating log fullness, or an event requiring dumping of an error log.

(A8) In some embodiments of the method of any one of A1-A7, writing data with the fast SLC programming mode includes retrieving the one or more memory programming parameters from volatile memory and adjusting at least one of the one or more memory programming parameters in accordance with an age metric or a performance metric associated with the non-volatile memory of the storage device.

(A9) In some embodiments of the method of any one of A1-A8, the method further includes: reserving a portion of the non-volatile memory of the storage device and configuring the reserved portion of the non-volatile memory of the storage device to write data with the fast SLC programming mode.

(A10) In some embodiments of the method of A9, the reserving and the configuring occur prior to detecting occurrence of the first event.

(A11) In some embodiments of the method of any one of A1-A10, the low read data is data satisfying predefined low read criteria.

(A12) In some embodiments of the method of any one of A11, the predefined low read criteria comprise a criterion that an estimated number of read operations for reading the low read data is below a predefined threshold number of read operations and/or a criterion that the low read data can be stored with low endurance.

(A13) In another aspect, a storage device includes non-volatile memory (e.g., one or more non-volatile storage devices, such as flash memory devices), one or more processors, and one or more controller modules. The one or more controller modules are configured to detect occurrence of a first event. In response to detecting the occurrence of the first event, the one or more controller modules are configured to: write low read data (e.g., data satisfying predefined low read criteria) to the non-volatile memory of the storage device with a fast SLC programming mode, distinct from a default SLC programming mode. Writing data with the fast SLC programming mode includes writing the low read data using one or more memory programming parameters distinct from a default set of memory programming parameters used for writing data to the non-volatile memory of the storage device with the default SLC programming mode. Also, writing data to the non-volatile memory of the storage device with the fast SLC programming mode takes less time per predefined unit of data than writing data to the non-volatile memory of the storage device with the default SLC programming mode. The one or more controller modules are further configured to: detect occurrence of a second event. In response to detecting the occurrence of the second event, the one or more controller modules are configured to write data to the non-volatile memory of the storage device with the default SLC programming mode, wherein writing data with the default SLC programming mode includes writing data using the default set of memory programming parameters.

(A14) In some embodiments of the storage device of A13, the one or more controller modules include: 1) an event occurrence detection module to detect occurrence of the first and the second events and 2) a data write module to: (a) write data to the non-volatile memory with the fast SLC programming mode in response to detecting the occurrence of the first event and (b) write data corresponding to the second event to the non-volatile memory with the default SLC programming mode, using the default set of memory programming parameters, in response to detecting occurrence of the second event.

(A15) In some embodiments of the storage device of any one of A13 or A14, the one or more controller modules are further configured to perform the method of any one of A2 to A12 described above.

(A16) In yet another aspect, a storage device includes non-volatile memory, one or more processors, and means for performing of the method of any one of A1 to A12 described above.

(A17) In yet another aspect, a non-transitory computer-readable storage medium stores one or more programs configured for execution by one or more processors of a storage device, the one or more programs including instructions for causing the storage device to perform the method of any one of A1 to A12 described above.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure pertinent aspects of the embodiments described herein.

FIG. 1 is a block diagram illustrating an implementation of a data storage system 100, in accordance with some embodiments. While some example features are illustrated, various other features have not been illustrated for the sake of brevity and so as not to obscure pertinent aspects of the example embodiments disclosed herein. To that end, as a non-limiting example, data storage system 100 includes a storage device 120 (also sometimes called an information storage device, or a data storage device, or a memory device), which includes a storage controller 124 and a storage medium 132, and is used in conjunction with or includes a computer system 110 (e.g., a host system or a host computer). In some embodiments, storage medium 132 is a single flash memory device while in other embodiments storage medium 132 includes a plurality of flash memory devices. In some embodiments, storage medium 132 is NAND-type flash memory or NOR-type flash memory. In some embodiments, storage medium 132 includes one or more three-dimensional (3D) memory devices. Further, in some embodiments, storage controller 124 is a solid-state drive (SSD) controller. However, other types of storage media may be included in accordance with aspects of a wide variety of embodiments (e.g., PCRAM, ReRAM, STT-RAM, etc.). In some embodiments, a flash memory device includes one or more flash memory die, one or more flash memory packages, one or more flash memory channels or the like. In some embodiments, data storage system 100 can contain one or more storage devices 120.

Computer system 110 is coupled to storage controller 124 through data connections 101. However, in some embodiments computer system 110 includes storage controller 124, or a portion of storage controller 124, as a component and/or as a subsystem. For example, in some embodiments, some or all of the functionality of storage controller 124 is implemented by software executed on computer system 110. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host, host system, client, or client system. In some embodiments, computer system 110 is a server system, such as a server system in a data center. In some embodiments, computer system 110 includes one or more processors, one or more types of memory, a display and/or other user interface components such as a keyboard, a touch-screen display, a mouse, a track-pad, a digital camera, and/or any number of supplemental I/O devices to add functionality to computer system 110. In some embodiments, computer system 110 does not have a display and other user interface components.

Storage medium 132 is coupled to storage controller 124 through connections 103. Connections 103 are sometimes called data connections, but typically convey commands in addition to data, and optionally convey metadata, error correction information and/or other information in addition to data values to be stored in storage medium 132 and data values read from storage medium 132. In some embodiments, however, storage controller 124 and storage medium 132 are included in the same device (i.e., an integrated device) as components thereof. Furthermore, in some embodiments, storage controller 124 and storage medium 132 are embedded in a host device (e.g., computer system 110), such as a mobile device, tablet, other computer or computer controlled device, and the methods described herein are performed, at least in part, by the embedded storage controller. Storage medium 132 may include any number (i.e., one or more) of memory devices including, without limitation, non-volatile semiconductor memory devices, such as flash memory device(s). For example, flash memory device(s) can be configured for enterprise storage suitable for applications such as cloud computing, for database applications, primary and/or secondary storage, or for caching data stored (or to be stored) in secondary storage, such as hard disk drives. Additionally and/or alternatively, flash memory device(s) can also be configured for relatively smaller-scale applications such as personal flash drives or hard-disk replacements for personal, laptop, and tablet computers.

Storage medium 132 is divided into a number of addressable and individually selectable blocks, such as selectable portion 133. In some embodiments, the individually selectable blocks are the minimum size erasable units in a flash memory device. In other words, each block contains the minimum number of memory cells that can be erased without erasing any other memory cells in the same flash memory device. Typically, when a flash memory block is erased, all memory cells in the block are erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device. For example, in some implementations, each block includes a number of pages, such as 64 pages, 128 pages, 256 pages or another suitable number of pages. In some embodiments (e.g., in some flash memory die), blocks are grouped into a plurality of zones. Each block zone can be independently managed to some extent, which increases the degree of parallelism for parallel operations and simplifies management of storage medium 132.

Additionally, if data is written to a storage medium in pages, but the storage medium is erased in blocks, pages in the storage medium may contain invalid (e.g., stale) data, but those pages cannot be overwritten until the whole block containing those pages is erased. In order to write to the pages with invalid data, the pages (if any) with valid data in that block are read and re-written to a new block and the old block is erased (or put on a queue for erasing). This process is called garbage collection. After garbage collection, the new block contains the pages with valid data and may have free pages that are available for new data to be written, and the old block can be erased so as to be available for new data to be written. Since flash memory can only be programmed and erased a limited number of times, the efficiency of the algorithm used to pick the next block(s) to re-write and erase has a significant impact on the lifetime and reliability of flash-based storage systems.

While erasure of a storage medium is performed on a block basis, in many embodiments, reading and programming (also called writing) of the storage medium is performed on a smaller subunit of a block (e.g., on a page basis, word line basis, or sector basis). The smaller subunit of a block typically consists of multiple memory cells (e.g., single-level cells or multi-level cells). In some embodiments, programming is performed on an entire page (i.e., all memory cells of the page are programmed (i.e., written) concurrently). In some embodiments, a multi-level cell (MLC) NAND flash has four possible states per cell, yielding two bits of information per cell. Further, in some embodiments, an MLC NAND has two page types: (1) a lower page (sometimes called fast page), and (2) an upper page (sometimes called slow page). In some embodiments, a triple-level cell (TLC) NAND flash has eight possible states per cell, yielding three bits of information per cell. Although the description herein uses TLC, MLC, and SLC as examples, those skilled in the art will appreciate that the embodiments described herein may be extended to memory cells that have more than eight possible states per cell, yielding more than three bits of information per cell. In some embodiments, the encoding format of the storage media (i.e., TLC, MLC, or SLC and/or a chosen data redundancy mechanism) is a choice made when data is actually written to the storage media.

In some embodiments, the storage device keeps track of (i.e., determines and/or maintains) a number of status metrics. In some embodiments, the status metrics tracked by the storage device include a write amplification metric of the storage device. In some embodiments, the status metrics tracked by the storage device include an over-provisioning metric (e.g., the percentage of total storage capacity that is in excess of the declared capacity of the storage device). In some embodiments, over-provisioning refers to the difference between the physical capacity of the storage device (e.g., the physical capacity less capacity set aside for management data structures and metadata) for storing user data (e.g., data stored in the storage system on behalf of a host or host system), and the logical capacity presented as available for use by a host or user. For example, in some embodiments, if a non-volatile memory of a storage device has 12 GB of total storage capacity (e.g., total storage capacity for storing user data) and 10 GB of declared capacity, then the non-volatile memory of the storage device has 2 GB of over-provisioning. Unlike declared capacity, which is the storage capacity available to a host, the extra capacity of over-provisioning is not visible to the host as available storage. Instead, over-provisioning is used to increase endurance of a storage device (e.g., by distributing the total number of writes and erases across a larger population of blocks and/or pages over time), improve performance, and reduce write amplification.

Write amplification is a phenomenon where the actual amount of physical data written to a storage medium (e.g., storage medium 132 of storage device 120) is a multiple of the logical amount of data written by a host (e.g., computer system 110, sometimes called a host) to the storage medium. As discussed above, when a block of storage medium must be erased before it can be re-written, the garbage collection process to perform these operations results in re-writing data one or more times. This multiplying effect increases the number of writes required over the life of a storage medium, which shortens the time it can reliably operate. The formula to calculate the write amplification of a storage system is given by equation:

$$\frac{\text{amount of data written to a storage medium}}{\text{amount of data written by a host}}$$

One of the goals of any flash memory based data storage system architecture is to reduce write amplification as much as possible so that available endurance is used to meet storage medium reliability and warranty specifications. Higher system endurance also results in lower cost as the storage system may need less over-provisioning. By reducing write amplification, the endurance of the storage medium is increased and the overall cost of the storage system is decreased.

Continuing with the description of FIG. 1, in some embodiments, storage controller 124 includes a management module 121-1, a host interface 129, a storage medium (I/O) interface 128, and additional module(s) 125. Storage controller 124 may include various additional features that have not been illustrated for the sake of brevity and so as not to obscure pertinent features of the example embodiments disclosed herein, and a different arrangement of features may be possible.

Host interface 129 provides an interface to computer system 110 through data connections 101. Similarly, storage medium interface 128 provides an interface to storage medium 132 though connections 103. In some embodiments, storage medium interface 128 includes read and write circuitry, including circuitry capable of providing reading signals to storage medium 132 (e.g., reading threshold voltages for NAND-type flash memory, as discussed below). In some embodiments, connections 101 and connections 103 are implemented as communication media over which commands and data are communicated, using a protocol such as DDR3, SCSI, SATA, SAS, or the like. In some embodiments, storage controller 124 includes one or more processing units (also sometimes called CPUs, processors, microprocessors, or microcontrollers) configured to execute instructions in one or more programs (e.g., in storage controller 124). In some embodiments, the one or more processors are shared by one or more components within, and in some cases, beyond the function of storage controller 124.

In some embodiments, management module 121-1 includes one or more central processing units (CPUs, also sometimes called processors, hardware processors, microprocessors or microcontrollers) 122 configured to execute instructions in one or more programs (e.g., in management module 121-1). In some embodiments, the one or more CPUs 122 are shared by one or more components within, and in some cases, beyond the function of storage controller 124. Management module 121-1 is coupled to host interface 129, additional module(s) 125, and storage medium interface 128 in order to coordinate the operation of these components. In some embodiments, one or more modules of management module 121-1 are implemented in management module 121-2 of computer system 110. In some embodiments, one or more processors of computer system 110 (not shown) are configured to execute instructions in one or more programs (e.g., in management module 121-2). Management module 121-2 is coupled to storage device 120 in order to manage the operation of storage device 120.

Additional module(s) 125 are coupled to storage medium interface 128, host interface 129, and management module 121-1. As an example, additional module(s) 125 may include an error control module to limit the number of uncorrectable errors inadvertently introduced into data during writes to memory and/or reads from memory. In some embodiments, additional module(s) 125 are executed in software by the one or more CPUs 122 of management module 121-1, and, in other embodiments, additional module(s) 125 are implemented in whole or in part using special purpose circuitry (e.g., to perform encoding and decoding functions). In some embodiments, additional module(s) 125 are implemented in whole or in part by software executed on computer system 110.

In some embodiments, additional module(s) 125 include power failure circuitry 125-1. In some embodiments, power failure circuitry 125-1 is used to detect a power failure condition in storage device 120 and trigger data hardening operations, and provide backup power to one or more components of storage device 120. In some embodiments, storage controller 124 coordinates power failure operations within storage device 120, sending instructions to NVM controllers to store data (e.g., metadata, and data in flight) in volatile memory to non-volatile memory, and optionally providing power failure information to host computer system 110.

As data storage densities of non-volatile semiconductor memory devices continue to increase, stored data is more prone to being stored and/or read erroneously. In some embodiments, error control coding can be utilized to limit the number of uncorrectable errors that are introduced by electrical fluctuations, defects in the storage medium, operating conditions, device history, write-read circuitry, etc., or a combination of these and various other factors.

In some embodiments, an error control module, included in additional module(s) 125, includes an encoder and a decoder. In some embodiments, the encoder encodes data by applying an error control code (ECC) to produce a codeword, which is subsequently stored in storage medium 132. When encoded data (e.g., one or more codewords) is read from storage medium 132, the decoder applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

In some embodiments, during a write operation, host interface 129 receives data to be stored in storage medium 132 from computer system 110. The data received by host interface 129 is made available to an encoder (e.g., in additional module(s) 125), which encodes the data to produce one or more codewords. The one or more codewords are made available to storage medium interface 128, which transfers the one or more codewords to storage medium 132 in a manner dependent on the type of storage medium being utilized.

In some embodiments, a read operation is initiated when computer system (host) 110 sends one or more host read commands (e.g., via data connections 101, or alternatively a separate control line or bus) to storage controller 124 requesting data from storage medium 132. Storage controller 124 sends one or more read access commands to storage medium 132, via storage medium interface 128, to obtain raw read data in accordance with memory locations (or logical addresses, object identifiers, or the like) specified by the one or more host read commands. Storage medium interface 128 provides the raw read data (e.g., comprising one or more codewords) to a decoder (e.g., in additional module(s) 125). If the decoding is successful, the decoded data is provided to host interface 129, where the decoded data is made available to computer system 110. In some embodiments, if the decoding is not successful, storage controller 124 may resort to a number of remedial actions or provide an indication of an irresolvable error condition.

Flash memory devices (in some embodiments, storage medium 132) utilize memory cells (e.g., SLC, MLC, and/or TLC) to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some embodiments, during a read operation, a reading threshold voltage is applied to the control gate of the transistor and the resulting sensed current or voltage is mapped to a data value.

The terms "cell voltage" and "memory cell voltage," in the context of flash memory cells, mean the threshold voltage of the memory cell, which is the minimum voltage that needs to be applied to the gate of the memory cell's transistor in order for the transistor to conduct current. Similarly, reading threshold voltages (sometimes also called reading signals and reading voltages) applied to flash memory cells are gate voltages applied to the gates of the flash memory cells to determine whether the memory cells conduct current at that gate voltage. In some embodiments, when a flash memory cell's transistor conducts current at a given reading threshold voltage, indicating that the cell voltage is less than the reading threshold voltage, the raw data value for that read operation is a "1" and otherwise the raw data value is a "0."

Figure 2:
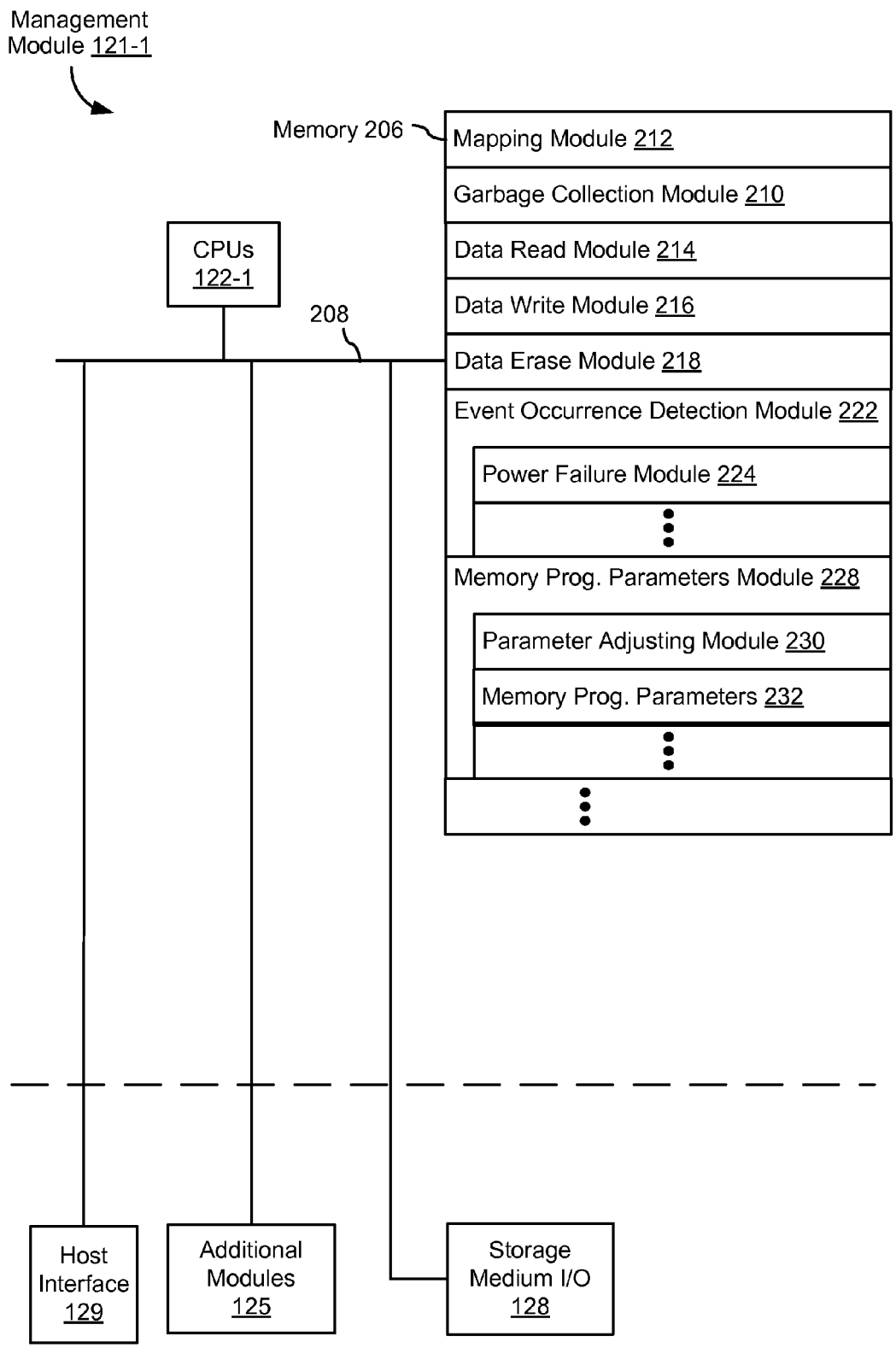
FIG. 2 is a block diagram illustrating an implementation of a management module, in accordance with some embodiments.

FIG. 2 is a block diagram illustrating a management module 121-1, in accordance with some embodiments, as shown in FIG. 1. Management module 121-1 typically includes one or more processing units (sometimes called CPUs or processors) 122-1 for executing modules, programs, and/or instructions stored in memory 206 (and thereby performing processing operations), memory 206 (sometimes called controller memory), and one or more communication buses 208 for interconnecting these components. The one or more communication buses 208 optionally include circuitry (sometimes called a chipset) that interconnects and controls communications between system components. Management module 121-1 is coupled to host interface 129, additional module(s) 125, and storage medium I/O 128 by the one or more communication buses 208.

Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from the CPU(s) 122-1. Memory 206, or alternatively the non-volatile memory device(s) within memory 206, comprises a non-transitory computer readable storage medium.

Figure 4:
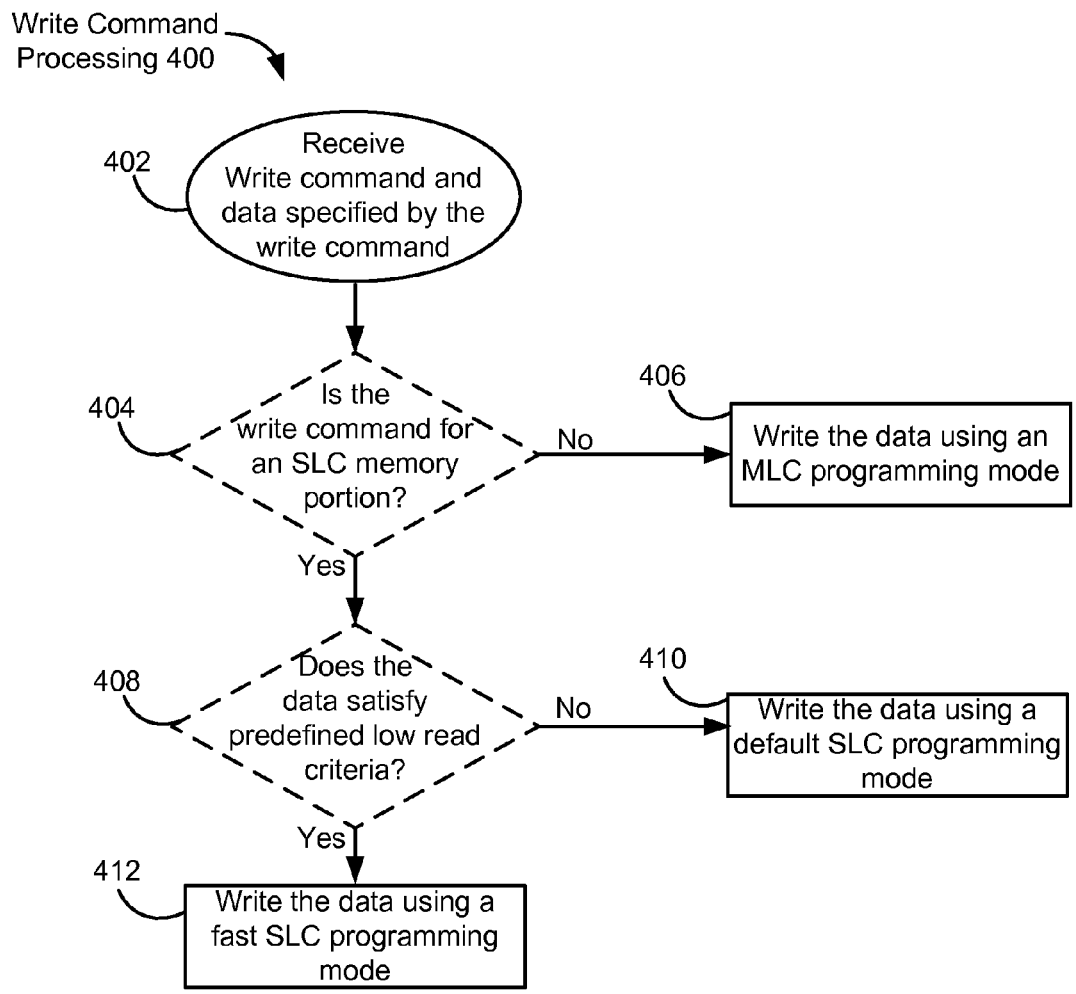
FIG. 4 illustrates a flowchart representation of a method of low read flash management in a storage device, in accordance with some embodiments.
Figure 5A:
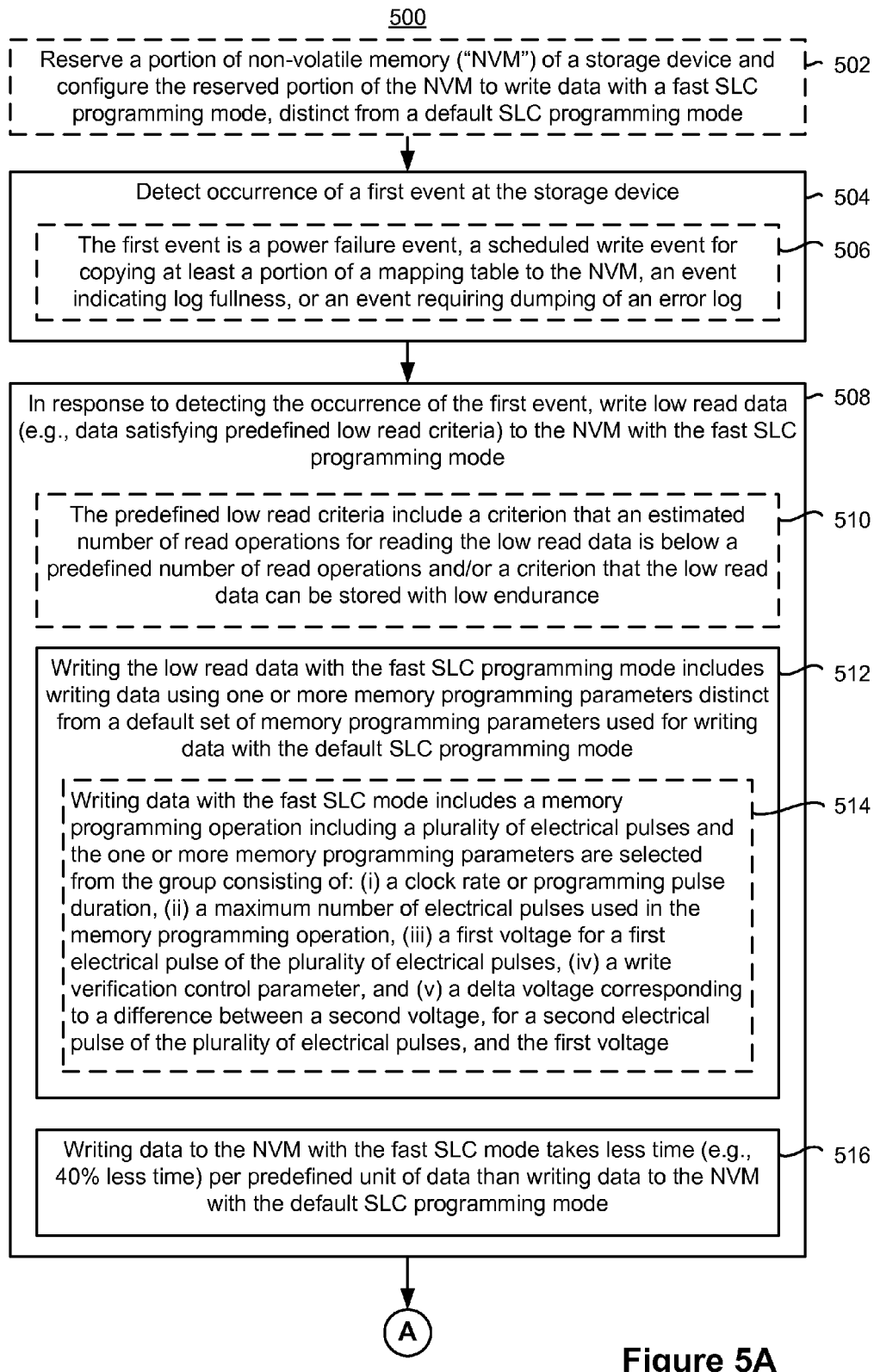
FIGS. 5A-5B illustrate a flowchart representation of a method of low read flash management in a storage device, in accordance with some embodiments.
Figure 5B:
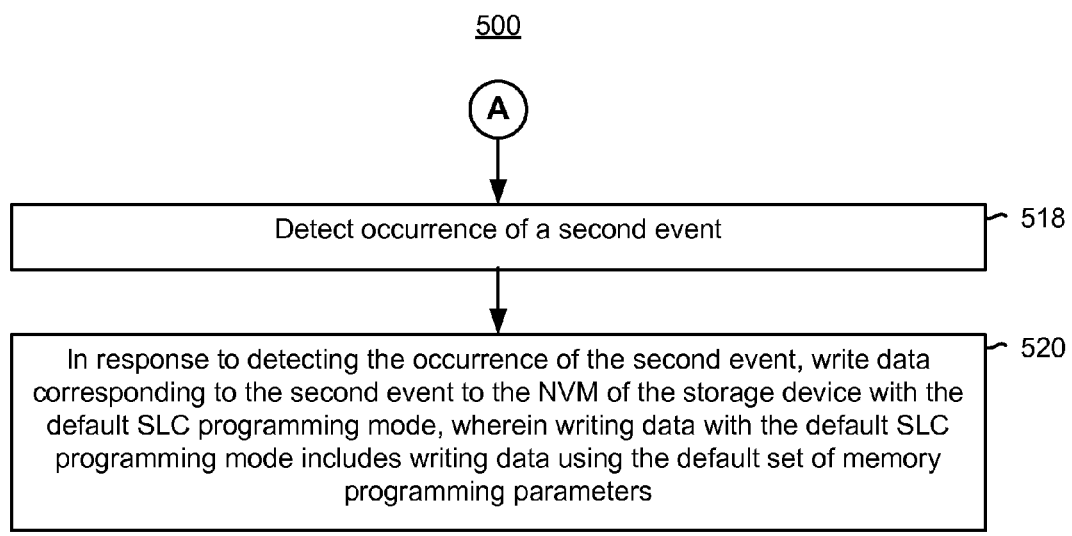

In some embodiments, memory 206, or the non-transitory computer-readable storage medium of memory 206 stores the following programs, modules, and data structures, or a subset or superset thereof:

mapping module 212 that is used for mapping (e.g., using a mapping table) logical addresses in a logical address space to physical addresses, and for maintaining and updating one or more address mapping tables and/or related data structures;

garbage collection module 210 that is used for garbage collection for one or more blocks in a storage medium (e.g., storage medium 132, FIG. 1);

data read module 214 that is used for reading data from one or more codewords, pages, or blocks in a storage medium (e.g., storage medium 132, FIG. 1);

data write module 216 that is used for writing data to one or more codewords, pages, or blocks in a storage medium (e.g., storage medium 132, FIG. 1); in some circumstances, the data write module 216 uses an appropriate programming mode for writing data based on detection of various events and/or based on the type of data being written (e.g., in response to detecting occurrence of a power failure event, the data write module 216 uses a fast SLC programming mode to write low read data to the non-volatile memory of the storage device, as discussed in more detail below in reference to FIGS. 4 and 5A-5B);

data erase module 218 that is used for erasing data from one or more blocks in a storage medium (e.g., storage medium 132, FIG. 1);

event occurrence detection module 222 that is used for detecting occurrence of events at a storage device or events affecting the storage device, optionally including:

power failure module 224 that is used for detecting occurrence of power failure events that affect the storage device and for instructing the data write module 216 to write data to non-volatile memory in response to detecting the occurrence of power failure events. In some embodiments or circumstances, execution of power failure module 224 is triggered by a signal or command from storage controller 124 (FIG. 1) or from power failure circuitry 125-1 (FIG. 1);

memory programming parameters module 228 that is used for retrieving and adjusting memory programming parameters, optionally including:

parameter adjusting module 230 for adjusting memory programming parameters (e.g., communicating with data write module 214 to adjust one or more memory programming parameters, corresponding to a write command, in accordance with an age metric or a performance metric for a respective erase block corresponding to the write command); and/or memory programming parameters 232 for storing a plurality of sets of memory programming parameters (e.g., a first set of memory programming parameters for write commands using a fast SLC programming mode and a different set of memory programming parameters for write commands using a first (or default) SLC mode).

Each of the above-identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the non-transitory computer readable storage medium of memory 206, provide instructions for implementing some of the methods described below. In some embodiments, some or all of these modules may be implemented with specialized hardware circuits that subsume part or all of the module functionality.

Although FIG. 2 shows management module 121-1 in accordance with some embodiments, FIG. 2 is intended more as a functional description of the various features which may be present in management module 121-1 than as a structural schematic of the embodiments described herein. In practice, and as recognized by those of ordinary skill in the art, the programs, modules, and data structures shown separately could be combined and some programs, modules, and data structures could be separated.

Figure 3A:
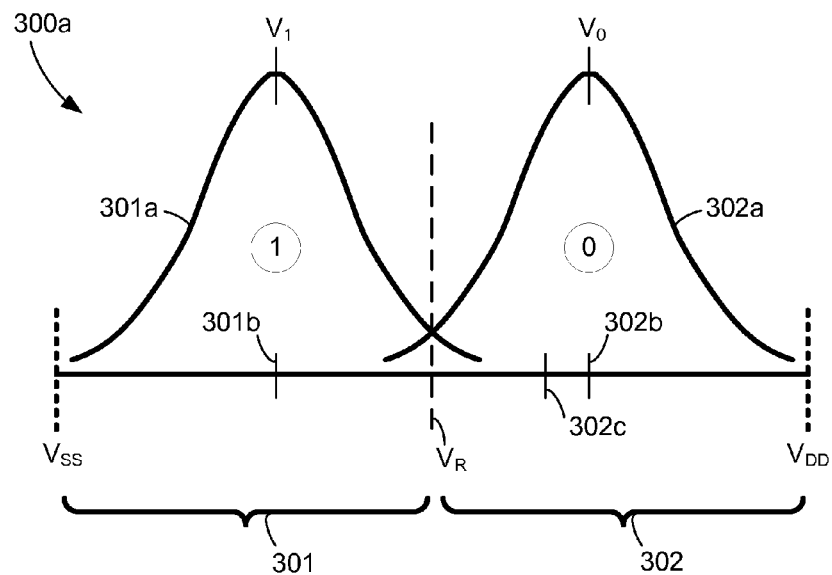
FIG. 3A is a simplified, prophetic diagram of voltage distributions 300a found in a single-level flash memory cell (SLC) over time, in accordance with some embodiments.

FIG. 3A is a simplified, prophetic diagram of voltage distributions 300a found in a single-level flash memory cell (SLC) over time, in accordance with some embodiments. The voltage distributions 300a shown in FIG. 3A have been simplified for illustrative purposes. In this example, the SLC's voltage range extends approximately from a voltage, $V_{SS}$, at a source terminal of an NMOS transistor to a voltage, $V_{DD}$, at a drain terminal of the NMOS transistor. As such, voltage distributions 300a extend between $V_{SS}$ and $V_{DD}$.

Sequential voltage ranges 301 and 302 between source voltage $V_{SS}$ and drain voltage $V_{DD}$ are used to represent corresponding bit values "1" and "0," respectively. Each voltage range 301, 302 has a respective center voltage $V_1$ 301b, $V_0$ 302b. As described below, in many circumstances the memory cell current sensed in response to an applied reading threshold voltage is indicative of a memory cell voltage different from the respective center voltage $V_1$ 301b or $V_0$ 302b corresponding to the respective bit value written into the memory cell. Errors in cell voltage, and/or the cell voltage sensed when reading the memory cell, can occur during write operations, read operations, or due to "drift" of the cell voltage between the time data is written to the memory cell and the time a read operation is performed to read the data stored in the memory cell. For ease of discussion, these effects are collectively described as "cell voltage drift." Each voltage range 301, 302 also has a respective voltage distribution 301a, 302a that may occur as a result of any number of a combination of error-inducing factors, examples of which are identified above.

In some implementations, a reading threshold voltage $V_R$ is applied between adjacent center voltages (e.g., applied proximate to the halfway region between adjacent center voltages $V_1$ 301b and $V_0$ 302b). Optionally, in some implementations, the reading threshold voltage is located between voltage ranges 301 and 302. In some implementations, reading threshold voltage $V_R$ is applied in the region proximate to where the voltage distributions 301a and 302a overlap, which is not necessarily proximate to the halfway region between adjacent center voltages $V_1$ 301b and $V_0$ 302b.

In some embodiments or circumstances, low read data is purposefully written so that the center 302c of the voltage distribution of the memory cells storing "0" data values is, on average, below the center of a voltage distribution of memory cells storing "0" data values written using standard programming parameters. In some embodiments, if the data being written is low read data (discussed in more detail below, in particular, in reference to FIGS. 4 and 5A-5B), then because the data only needs to be read back a limited number of times, cell voltage drift and read disturb performance are less of a concern and writing data as quickly as possible is a much greater concern. For example, if low read data is being written to a flash memory storage device after a power failure affecting the storage device, then, in some embodiments, the low read data is written to the flash memory storage device using a fast SLC programming mode that is designed to program the flash memory cells, with a density of one bit per cell, so that the data is available for reading back a small number of times after the device recovers from the power failure. In some implementations, the memory cell voltage distribution for cells programmed to store a "0" is narrower than the distribution shown in FIG. 3A, and the distribution is centered at a lower voltage, e.g., voltage 302c, than the typical target center voltage 302b. As is standard, memory cells storing "1" values need not be programmed, and thus those cells will have a standard distribution of threshold voltages. Exemplary memory programming parameters used with the fast SLC programming mode are discussed in more detail below in reference to operation 512 (FIG. 5A).

In order to increase storage density in flash memory, flash memory has developed from single-level (SLC) cell flash memory to multi-level cell (MLC) flash memory so that two or more bits can be stored by each memory cell. As discussed below with reference to FIG. 3B, a MLC flash memory device is used to store multiple bits by using voltage ranges within the total voltage range of the memory cell to represent different bit-tuples. A MLC flash memory device is typically more error-prone than a SLC flash memory device created using the same manufacturing process because the effective voltage difference between the voltages used to store different data values is smaller for a MLC flash memory device. Moreover, due to any number of a combination of factors, such as electrical fluctuations, defects in the storage medium, operating conditions, device history, and/or write-read circuitry, a typical error includes a stored voltage level in a particular MLC being in a voltage range that is adjacent to the voltage range that would otherwise be representative of the correct storage of a particular bit-tuple. As discussed in greater detail below with reference to FIG. 3B, the impact of such errors can be reduced by gray-coding the data, such that adjacent voltage ranges represent single-bit changes between bit-tuples.

Figure 3B:
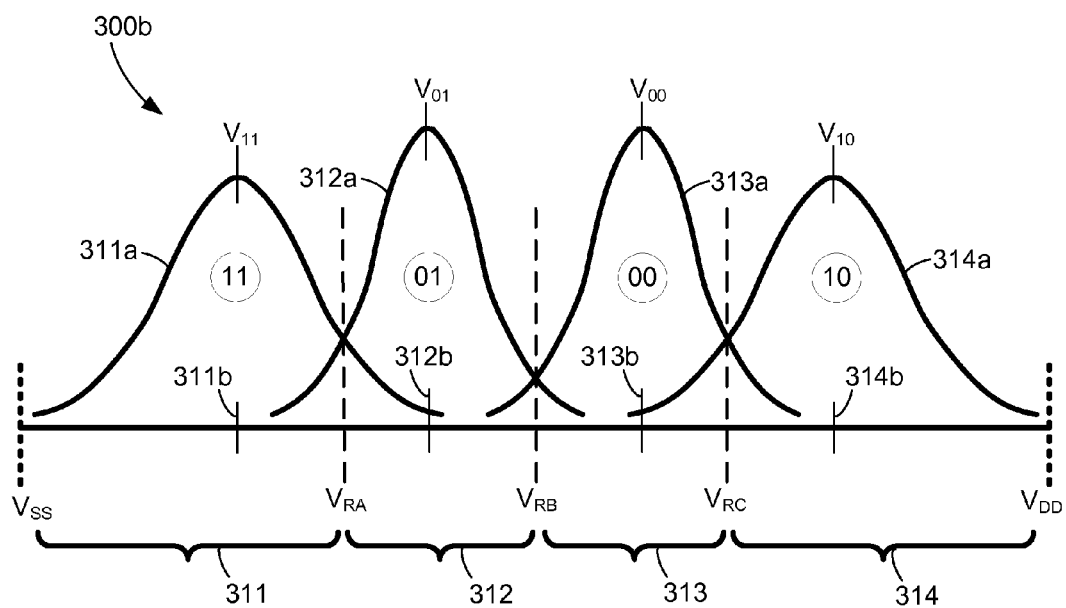
FIG. 3B is a simplified, prophetic diagram of voltage distributions 300b found in a multi-level flash memory cell (MLC) over time, in accordance with some embodiments.

FIG. 3B is a simplified, prophetic diagram of voltage distributions 300b found in a multi-level flash memory cell (MLC) over time, in accordance with some embodiments. The voltage distributions 300b shown in FIG. 3B have been simplified for illustrative purposes. The cell voltage of a MLC approximately extends from a voltage, $V_{SS}$, at the source terminal of a NMOS transistor to a voltage, $V_{DD}$, at the drain terminal. As such, voltage distributions 300b extend between $V_{SS}$ and $V_{DD}$.

Sequential voltage ranges 311, 312, 313, 314 between the source voltage $V_{SS}$ and drain voltages $V_{DD}$ are used to represent corresponding bit-tuples "11," "01," "00," "10," respectively. Each voltage range 311, 312, 313, 314 has a respective center voltage 311b, 312b, 313b, 314b. Each voltage range 311, 312, 313, 314 also has a respective voltage distribution 311a, 312a, 313a, 314a that may occur as a result of any number of a combination of factors, such as electrical fluctuations, defects in the storage medium, operating conditions, device history (e.g., number of program-erase (P/E) cycles), and/or imperfect performance or design of write-read circuitry.

Ideally, during a write operation, the charge on the floating gate of the MLC would be set such that the resultant cell voltage is at the center of one of the ranges 311, 312, 313, 314 in order to write the corresponding bit-tuple to the MLC. Specifically, the resultant cell voltage would be set to one of $V_{11}$ 311b, $V_{01}$ 312b, $V_{00}$ 313b and $V_{10}$ 314b in order to write a corresponding one of the bit-tuples "11," "01," "00" and "10." In reality, due to the factors mentioned above, the initial cell voltage may differ from the center voltage for the data written to the MLC.

Reading threshold voltages $V_{RA}$, $V_{RB}$ and $V_{RC}$ are positioned between adjacent center voltages (e.g., positioned at or near the halfway point between adjacent center voltages) and, thus, define threshold voltages between the voltage ranges 311, 312, 313, 314. During a read operation, one of the reading threshold voltages $V_{RA}$, $V_{RB}$ and $V_{RC}$ is applied to determine the cell voltage using a comparison process. However, due to the various factors discussed above, the actual cell voltage, and/or the cell voltage received when reading the MLC, may be different from the respective center voltage $V_{11}$ 311*b*, $V_{01}$ 312*b*, $V_{00}$ 313*b* or $V_{10}$ 314*b* corresponding to the data value written into the cell. For example, the actual cell voltage may be in an altogether different voltage range, strongly indicating that the MLC is storing a different bit-tuple than was written to the MLC. More commonly, the actual cell voltage may be close to one of the read comparison voltages, making it difficult to determine with certainty which of two adjacent bit-tuples is stored by the MLC.

Errors in cell voltage, and/or the cell voltage received when reading the MLC, can occur during write operations, read operations, or due to "drift" of the cell voltage between the time data is written to the MLC and the time a read operation is performed to read the data stored in the MLC. For ease of discussion, sometimes errors in cell voltage, and/or the cell voltage received when reading the MLC, are collectively called "cell voltage drift."

One way to reduce the impact of a cell voltage drifting from one voltage range to an adjacent voltage range is to gray-code the bit-tuples. Gray-coding the bit-tuples includes constraining the assignment of bit-tuples such that a respective bit-tuple of a particular voltage range is different from a respective bit-tuple of an adjacent voltage range by only one bit. For example, as shown in FIG. 3B, the corresponding bit-tuples for adjacent ranges 301 and 302 are respectively "11" and "01," the corresponding bit-tuples for adjacent ranges 302 and 303 are respectively "01" and "00," and the corresponding bit-tuples for adjacent ranges 303 and 304 are respectively "00" and "10." Using gray-coding, if the cell voltage drifts close to a read comparison voltage level, the error is typically limited to a single bit within the 2-bit bit-tuple.

Although the description of FIG. 3B uses an example in which q=2 (i.e., 2 bits per cell in a MLC flash memory), those skilled in the art will appreciate that the embodiments described herein may be extended to memory cells that have more than four possible states per cell, yielding more than two bits of information per cell. For example, in some embodiments, a triple-level memory cell (TLC) has eight possible states per cell, yielding three bits of information per cell. As another example, in some embodiments, a quad-level memory cell (QLC) has 16 possible states per cell, yielding four bits of information per cell. As another example, in some embodiments, a cell might store only 6 states, yielding approximately 2.5 bits of information per cell, meaning that two cells together would provide 36 possible states, more than sufficient to store 5 bits of information per pair of cells.

In some embodiments, low read data is written using fast programming parameters that enable faster writing than standard programming parameters, but result in the stored data having lower endurance than data written using standard programming parameters. Furthermore, in some embodiments, more accurate read operations (e.g., lower error read operations) for reading data from memory cells programmed using the fast programming parameters can be performed by using one or more reading thresholds $V_R$ that are lower (shifted to the left, in FIG. 3A or 3B) than the default reading thresholds used to read data written to memory cells (e.g., in the same flash memory block or same flash memory die) using the standard programming parameters.

Although FIGS. 3A-3B illustrate exemplary voltage ranges for SLC and MLC (e.g., voltage ranges 301, 302, FIG. 3A, and voltage ranges 311, 312, 313, and 314, FIG. 3B), in some embodiments, the voltage ranges are different for memory cells that are used to store different types of data. For example, for memory cells that are used to store low read data (e.g., memory cells that are part of a reserved portion (die, block, or super block) of a non-volatile memory device), the voltage ranges will have a narrower and sharper shape than the voltage ranges for memory cells used to store regular data (e.g., data other than low read data), at least in part because low read data is seldom read, and therefore the memory cells storing low read data are exposed to many fewer read disturbs, which cause broadening of the voltage ranges, than the memory cells storing regular data.

FIG. 4 illustrates a flowchart representation of a method of efficiently managing the writing of data, including low read data, within a storage system, in accordance with some embodiments. With reference to the data storage system 100 pictured in FIG. 1, in some embodiments, a method 400 is performed by a storage device (e.g., storage device 120) or one or more components of the storage device (e.g., storage controller 124). In some embodiments, the method 400 is governed by instructions that are stored in a non-transitory computer-readable storage medium and that are executed by one or more processors of a device, such as the one or more processing units (CPUs) 122-1 of management module 121-1 (FIG. 2). In some embodiments, some of the operations of method 400 are performed at a host system (e.g., computer system 110) that is operatively coupled with the storage device and other operations of method 400 are performed at the storage device. In some embodiments, method 400 is governed, at least in part, by instructions that are stored in a non-transitory computer-readable storage medium and that are executed by one or more processors of the host system (the one or more processors of the host system are not shown in FIG. 1). For ease of explanation, the following describes method 400 as performed by the storage device (e.g., by storage controller 124 of storage device 120, FIG. 1). With reference to FIG. 2, in some embodiments, the operations of method 400 are performed, at least in part, by a data write module (e.g., data write module 216, FIG. 2), an event occurrence detection module (e.g., event occurrence detection module 222, FIG. 2), a power failure module (e.g., power failure module 224, FIG. 2), a memory programming parameters module (e.g., memory programming parameters module 228), a parameter adjusting module (e.g., parameter adjusting module 230), and/or a memory programming parameters module (e.g., memory programming parameters module 232) of management module 121-1.

The method 400 begins, in some embodiments, when the storage device (e.g., storage device 120, FIG. 1, or a component thereof such as data write module 216, FIG. 2) receives (402) a write command and data specified by the write command. In some embodiments, the storage device optionally determines whether the write command is for an SLC memory portion. In accordance with a first determination (404) that the write command is not for an SLC memory portion (e.g., the write command is instead for an MLC, TLC, or QLC memory portion), the storage device writes (406) the data using an MLC programming mode. The MLC programming mode is a programming mode that is used to write data to MLC memory portions and the MLC programming mode is distinct from both a default SLC programming mode and from a fast SLC programming mode. Thus, in some embodiments, three distinct programming modes are provided and they are selectively utilized based on the location to which the data is to be written (e.g., an SLC or MLC memory portion) and/or based on the type of data being written (e.g., low read data).

In accordance with the first determination (404) instead indicating that the write command is for an SLC memory portion, the storage device proceeds to conduct a second determination (408) by determining whether the data satisfies predefined low read criteria. In some embodiments, the predefined low read criteria include a criterion that an estimated number of read operations for reading the low read data is below a predefined number of read operations and/or a criterion that the low read data can be stored with low endurance (discussed in more detail below with reference to FIGS. 5A-5B). In some embodiments, the predefined low read criteria include a criterion that the data is any one of a set of predefined data types (e.g., address translation table updates, update log records, etc.), or is data being written in response to a predefined event (e.g., data being written in response to a power fail event). For example, the predefined data types corresponding to first types of data (e.g., data, such as log records, used solely for error recovery) that is rarely read, and/or second types of data (e.g., data saved during a power failure and used for power failure recovery) that are typically read only once or twice.

In accordance with the second determination indicating that the data does not satisfy the predefined low read criteria, the storage device writes (410) the data using the default SLC programming mode.

In accordance with the second determination (408) instead indicating that the data does satisfy the predefined low read criteria, the storage device writes (412) the data using the fast SLC programming mode. In some embodiments, writing data with the fast SLC programming mode takes less time (e.g., at least forty percent (40%) less time) per predefined unit of data than writing data with the default SLC programming mode. In some embodiments, writing data with the fast SLC programming mode takes fifty to sixty percent (50-60%) less time per predefined unit of data as compared to writing data with the default SLC programming mode. Typically, writing data using either the default SLC programming mode or the fast SLC programming mode includes writing data to a lower page of a memory portion within the non-volatile memory of the storage device.

The following is one specific example of the programming times (i.e., time to complete a write operation) associated with each of the three programming modes discussed above: 1) programming time for MLC programming mode=approximately 600 microseconds, 2) programming time for default SLC programming mode=approximately 450 microseconds, and 3) programming time for fast SLC programming mode=approximately 250 microseconds. Thus, the fast SLC programming mode is significantly faster than both the MLC and the default SLC programming modes. In some embodiments, the default SLC programming mode (and the MLC programming mode) is slower than the fast SLC programming mode due in part to the use of a program verify operation that is not used with the fast SLC programming mode. For example, writing data with the default SLC programming mode to a particular memory cell includes verifying that the charge of a floating gate is approximately at the center of a respective voltage range for the particular memory cell (this verification is referred to as a program verify operation). In order to further improve execution times for the fast SLC programming mode, in some embodiments, no program verify operations are performed (e.g., either by setting a PVerify count to be zero or by skipping the program verify operation completely). The fast SLC programming mode is discussed in more detail below in reference to FIGS. 5A-5B.

Although the first and second determinations above have both been described as optional, in some embodiments, one or both of the first and second determinations is/are required. Thus, in some embodiments, method 400 requires only conducting the second determination after receiving the data specified by the write command (402), while in other embodiments, the method 400 requires only conducting the first determination after receiving the data specified by the write command. For example, in some embodiments, the fast SLC programming mode is designed to perform write operations as quickly as possible and, thus, performing the second determination allows the storage device to first decide whether the fast SLC programming mode can be utilized (because the second determination reveals that the data is low read data) and avoids any extra processing time required to conduct the first determination.

Additional details concerning each of the processing steps for method 400, as well as details concerning additional processing steps, are presented below with reference to FIGS. 5A-5B.

FIGS. 5A-5B illustrate a flowchart representation of a method of efficiently managing low read data within a storage system, in accordance with some embodiments. With reference to the data storage system 100 pictured in FIG. 1, in some embodiments, a method 500 is performed by a storage device (e.g., storage device 120) or one or more components of the storage device (e.g., storage controller 124). In some embodiments, the method 500 is governed by instructions that are stored in a non-transitory computer-readable storage medium and that are executed by one or more processors of a device, such as the one or more processing units (CPUs) 122-1 of management module 121-1 (FIG. 2). In some embodiments, some of the operations of method 500 are performed at a host system (e.g., computer system 110) that is operatively coupled with the storage device and other operations of method 500 are performed at the storage device. In some embodiments, method 500 is governed, at least in part, by instructions that are stored in a non-transitory computer-readable storage medium and that are executed by one or more processors of the host system (the one or more processors of the host system are not shown in FIG. 1). For ease of explanation, the following describes method 500 as performed by the storage device (e.g., by storage controller 124 of storage device 120, FIG. 1). With reference to FIG. 2, in some embodiments, the operations of method 500 are performed, at least in part, by a data write module (e.g., data write module 216, FIG. 2), an event occurrence detection module (e.g., event occurrence detection module 222, FIG. 2), a power failure module (e.g., power failure module 224, FIG. 2), a memory programming parameters module (e.g., memory programming parameters module 228), a parameter adjusting module (e.g., parameter adjusting module 230), and/or a memory programming parameters module (e.g., memory programming parameters module 232) of management module 121-1.

With reference to FIG. 5A, the storage device optionally reserves (502) a portion of non-volatile memory ("NVM") of a storage device and configures the reserved portion of the NVM to write data with a fast SLC programming mode, distinct from a default SLC programming mode (as discussed above in reference to FIG. 4, the fast SLC programming mode is also distinct from an MLC programming mode). In some embodiments, the reserved portion is a block, super block, die plane, or die memory portion. In some embodiments, the reserving occurs at a manufacturing time (or factory configuration of the storage device) and prior to shipment of the storage device to a customer. For example, the trim registers associated with a reserved NVM die can be set in accordance with the fast SLC programming mode (e.g., configured to execute all write operations directed to the reserved NVM die using one or more memory programming parameters (discussed below in reference to operations 512 and 514)). In this way, the manufacturer of the storage device is able to ensure that at least the reserved portion of the storage device will be available for write operations using the fast SLC programming mode. In some embodiments, a size of the reserved portion is determined in accordance with low read requirements (e.g., data that is reported back to the manufacturer of the storage device and is then used to determine statistics associated with low read data usage on similar storage devices) associated with similar storage devices (e.g., storage devices used in a single data center for the same company).

Still referring to FIG. 5A, the storage device (e.g., storage device 120, FIG. 1, or a component thereof such as event occurrence detection module 222 or power failure module 224, FIG. 2) detects (504) occurrence of a first event. In some embodiments, the first event is a power failure event (e.g., a PFail event), a scheduled write event for copying at least a portion of a mapping table to the NVM (e.g., a flash translation layer table segment write event), an event indicating log fullness (e.g., a flash translation layer update log fullness event), or an event requiring dumping of an error log (e.g., detecting an error affecting a portion of the storage device and dumping error log data associated with the error for diagnostic purposes) (506). In some embodiments, the power failure event includes the event requiring dumping of the error log (in other words, the error log data may provide details associated with the power failure event and, thus, in response to detecting a power failure event, the storage device also detects an event requiring dumping of the error log in order to help diagnose the source of the power failure).

In response to detecting the occurrence of the first event, the storage device writes (508) low read data to the NVM with the fast SLC programming mode. In some embodiments, writing the low read data includes writing data corresponding to the first event or writing data that is specified by the first event such as data corresponding to a write command. In some embodiments, the low read data includes power fail data, a mapping table or a portion of a mapping table that maps logical addresses (e.g., LBA) in a logical address space to physical addresses in the non-volatile memory, a log containing data corresponding to write commands and un-map commands, error log data, and/or debug trace dump data. In some embodiments, low read data is data satisfying predefined low read criteria. In some embodiments, the predefined low read criteria include (510) a criterion that an estimated number of read operations for reading the low read data (e.g., estimated based on number of read operations required for data that is similar to the low read data, such as an average number of read operations required for all logical-to-physical mapping table data stored in the NVM) is below a predefined number of read operations and/or a criterion that the low read data can be stored with low endurance. In some embodiments, the predefined low read criteria further include a criterion that the low read data is of a predefined type (e.g., mapping table data, error log data, and other data that has low read requirements) and/or a criterion that the low read data has a low erase/program cycle requirement. In some embodiments, the low read criteria include a single low read criterion (one of the threshold number criterion, the low endurance criterion, the predefined type criterion, or the low erase/program cycle criterion). In some embodiments, the threshold number of read operations is greater than or equal to one and less than or equal to ten.

In some embodiments, writing the low read data with the fast SLC programming mode includes (512) writing data using one or more (or, alternatively, two or more) memory programming parameters distinct from a default set of memory programming parameters used for writing data with the default SLC programming mode. In some embodiments, writing data with the fast SLC mode includes (514) a memory programming operation including a plurality of electrical pulses, and the one or more memory programming parameters are selected from the group consisting of: (i) a clock rate or programming pulse duration, (ii) a maximum number of electrical pulses used in the memory programming operation, (iii) a first voltage for a first electrical pulse or first set of electrical pulses of the plurality of electrical pulses, (iv) a write verification control parameter, and (v) a delta voltage corresponding to a difference between a second voltage, for a second electrical pulse or second set of electrical pulses of the plurality of electrical pulses, and the first voltage. In some embodiments, the one or more memory programming parameters are selected by sending a precursor command (e.g., a command that instructs the storage device to use a particular set of the one or more memory programming parameters) to the non-volatile memory prior to writing data to the NVM with a desired programming mode (e.g., writing the low read data with the fast SLC programming mode). In this way, the storage device is able to flexibly use any one of the fast SLC programming mode, the default SLC programming mode, and the MLC programming mode (discussed above in reference to FIG. 4) by simply sending the precursor command associated with the desired programming mode. In some embodiments, the storage device or a portion thereof (such as a reserved NVM die) is configured to write data using the fast SLC programming mode by default and, thus, the precursor command is used only to switch to use either the MLC programming mode or the default SLC programming mode.

In some embodiments, at least one memory programming parameter of the one or more memory programming parameters used with the fast SLC programming mode will be different from the default set of memory programming parameters. Three exemplary memory programming parameters are provided below to illustrate how the one or more memory programming parameters used with the fast SLC programming mode are different from the default set of memory programming parameters.

As a first example of a memory programming parameter used with the fast SLC programming mode that is different from the default set, the clock rate or programming pulse duration used in the fast SLC programming mode is less than the programming pulse duration used in the default SLC programming mode. For example, a reduced pulse duration rate is achieved by increasing a clock rate, which reduces a corresponding clock period. In some embodiments, the clock rate is also referred to as clock frequency and a higher clock rate/frequency allows the storage device to complete more memory programming operations (e.g., more write operations) per unit of time than a lower clock rate.

As a second example of a memory programming parameter used with the fast SLC programming mode that is different from the default set, the number of electrical pulses used to write data (using memory programming operations) with the fast SLC programming mode is lower than a default number of electrical pulses used to write data (using memory programming operations) performed with the default SLC programming mode. In some embodiments, the number of electrical pulses is a count of electrical pulses used to write data to the NVM. In some embodiments, the count of electrical pulses associated with memory programming operations in the fast SLC programming mode is 60%, 70%, or 80% of the default count. In some embodiments, the one or more memory programming parameters used to write data with the fast SLC programming mode include only the lowered count of electrical pulses and, in other embodiments, the one or more memory programming parameters used to write data with the fast SLC programming mode include both the reduced clock period (as described in the first example above) and the lowered count of electrical pulses. In some embodiments, the lowered number of electrical pulses is used in conjunction with the reduced clock period, in order to ensure that programming operations are completed within the timing constraints imposed by the reduced clock rate.

A third example of a memory programming parameter used with the fast SLC programming mode that is different, in some embodiments, from the corresponding default memory programming parameter is the first voltage (also called the initial programming voltage) for the first electrical pulse in the set of electric pulses used to write data to the NVM. In this example, the first voltage used when writing data using the fast SLC programming mode is smaller than the default first voltage used when writing data using the default SLC programming mode.

Another example of a memory programming parameter used with the fast SLC programming mode that is different, in some embodiments, from the corresponding default memory is the delta voltage, which is the amount by which the second voltage for a second electrical pulse or second set of electrical pulses is greater than the first voltage for the first electrical pulse or first set of electrical pulses. In this example, the delta voltage used when writing data using the fast SLC programming mode is smaller than the delta voltage used when writing data using the default SLC programming mode.

As one further example, a number (or count) of program verify operations associated with the fast SLC programming mode is less than a number of program verify operations associated with the default SLC programming mode. For example, the number of program verify operations associated with the fast SLC programming mode is zero (in other words, no program verify operations are performed at all with the fast SLC programming mode). Additional details regarding program verify operations are also provided above in reference to FIG. 4.

In some embodiments, the one or more memory programming parameters are used when writing data with the fast SLC programming mode, resulting in cell voltages that are, on average, lower than the cell voltages that would result if the same data were written using the default SLC programming mode, as explained above with respect to FIGS. 3A and 3B.

In some embodiments, the one or more memory programming parameters discussed above are retrieved from volatile memory before writing the low read data. In these embodiments, writing data with the fast SLC programming mode includes retrieving the one or more memory programming parameters from volatile memory (e.g., using memory programming parameters module 228 to retrieve the one or more memory programming parameters from memory programming parameters 232, FIG. 2). In some embodiments, at least one of the retrieved one or more memory programming parameters is adjusted (e.g., by the parameter adjusting module 230, FIG. 2) in accordance with an age metric or a performance metric associated with the non-volatile memory of the storage device.

In some embodiments, writing data to the non-volatile memory of the storage device with the fast SLC programming mode takes at least 40% less time per predefined unit of data (e.g., per page) as compared to writing data to the non-volatile memory of the storage device with the default SLC programming mode (516). In some embodiments, writing data with the fast SLC programming mode takes 50-60% less time per predefined unit of data as compared to writing data with the default SLC programming mode. Typically, writing data using either the default SLC programming mode or the fast SLC programming mode includes writing data to a lower page of a memory portion within the non-volatile memory of the storage device.

Turning now to FIG. 5B, in some embodiments, the storage device detects (518) occurrence of a second event. In some embodiments, the second event is a write command from host or a write command associated with garbage collection at the storage device. Typically, the second event is an event of a different type than the first event. In response to detecting the occurrence of the second event, the storage device writes (520) data corresponding to the second event to the NVM of the storage device with the default SLC programming mode, wherein writing data with the default SLC programming mode includes writing data using the default set of memory programming parameters. Stated another way, for data that is not low read data (e.g., data specified by a write command that is received from a host), the storage device use the default SLC programming mode to write the data and does not use the fast SLC programming mode. In this way, the storage device is able to efficiently choose the programming mode utilized for individual write commands based on the type of data specified by the write command and/or based on the memory portion to which the data is being written (discussed in more detail above).

In some embodiments, after writing the low read data with the fast SLC programming mode, the storage device receives a read command for at least a portion of the low read data. In response to receiving the read command for at least the portion of the low read data, the storage device performs a read operation by using one or more reading thresholds that are lower than default reading thresholds used to read data that is not low read data (as discussed above in reference to FIGS. 3A-3B).

It will be understood that, although the terms "first," "second," etc. may be used herein to describe various elements, these elements should not be limited by these terms. These terms are only used to distinguish one element from another. For example, a first transistor could be termed a second transistor, and, similarly, a second transistor could be termed a first transistor, without changing the meaning of the description, so long as all occurrences of the "first transistor" are renamed consistently and all occurrences of the "second transistor" are renamed consistently. The first transistor and the second transistor are both transistors, but they are not the same transistor.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method of managing a storage device that includes non-volatile memory, the method comprising:
   detecting occurrence of a first event;
   in response to detecting the occurrence of the first event, writing low read data to the non-volatile memory of the storage device with a fast single-level cell (SLC) programming mode, distinct from a default SLC programming mode, wherein:
     low read data is data satisfying predefined low read criteria,
     writing data with the fast SLC programming mode includes writing data with a density of one data bit per memory cell using one or more memory programming parameters distinct from a default set of memory programming parameters used for writing data with the default SLC programming mode, and
     writing data with the fast SLC programming mode takes less time per predefined unit of data than writing data with the default SLC programming mode;
   detecting occurrence of a second event; and
   in response to detecting the occurrence of the second event, writing data corresponding to the second event to the non-volatile memory of the storage device with the default SLC programming mode, wherein writing data with the default SLC programming mode includes writing data with a density of one data bit per memory cell using the default set of memory programming parameters.

2. The method of claim 1, wherein writing data to the non-volatile memory of the storage device with the fast SLC programming mode takes at least 40% less time per predefined unit of data as compared to writing data to the non-volatile memory of the storage device with the default SLC programming mode.

3. The method of claim 1, wherein:
   writing data with the fast SLC programming mode includes a memory programming operation comprising a plurality of electrical pulses, and
   the one or more memory programming parameters used for writing data with the fast SLC programming mode include one or more parameters selected from the group consisting of: a clock rate or programming pulse duration, a maximum number of electrical pulses used in the memory programming operation, a first electrical pulse or first set of electrical pulses of the plurality of electrical pulses, a write verification control parameter, and a delta voltage corresponding to a difference between a second voltage, for a second electrical pulse or second set of electrical pulses of the plurality of electrical pulses, and the first voltage.

4. The method of claim 3, wherein the clock rate or programming pulse duration used in the fast SLC programming mode is less than the clock rate or programming pulse duration used in the default SLC programming mode.

5. The method of claim 3, wherein the number of electrical pulses within the plurality of electrical pulses is lower than a default number of electrical pulses within a default plurality of electrical pulses.

6. The method of claim 5, wherein the first voltage for the first electrical pulse is greater than a default voltage for each electrical pulse within the default plurality of electrical pulses.

7. The method of claim 1, wherein the first event is a power failure event, a scheduled write event for copying at least a portion of a mapping table to the non-volatile memory of the storage device, an event indicating log fullness, or an event requiring dumping of an error log.

8. The method of claim 1, wherein writing data with the fast SLC programming mode includes:
   retrieving the one or more memory programming parameters from volatile memory; and
   adjusting at least one of the one or more memory programming parameters in accordance with an age metric or a performance metric associated with the non-volatile memory of the storage device.

9. The method of claim 1, further comprising:
   reserving a portion of the non-volatile memory of the storage device; and
   configuring the reserved portion of the non-volatile memory of the storage device to write data with the fast SLC programming mode.

10. The method of claim 9, wherein the reserving and the configuring occur prior to detecting occurrence of the first event.

11. The method of claim 1, wherein the predefined low read criteria comprise a criterion that an estimated number of read operations for reading the low read data is below a predefined threshold number of read operations and/or a criterion that the low read data can be stored with low endurance.

12. A storage device, comprising:
    non-volatile memory; and
    a storage controller, the storage controller including one or more controller modules configured to:
      detect occurrence of a first event;
      in response to detecting the occurrence of the first event, write low read data to the non-volatile memory of the storage device, wherein low read data is data satisfying predefined low read criteria, wherein:
        writing the low read data includes writing the low read data to the non-volatile memory of the storage device with a fast single-level cell (SLC)

programming mode, distinct from a default SLC programming mode to the non-volatile memory of the storage device, writing data with the fast SLC programming mode includes writing the low read data with a density of one data bit per memory cell using one or more memory programming parameters distinct from a default set of memory programming parameters for writing data to the non-volatile memory of the storage device with the default SLC programming mode, and writing data to the non-volatile memory of the storage device with the fast SLC programming mode takes less time per predefined unit of data than writing data to the non-volatile memory of the storage device with the default SLC programming mode;

detect occurrence of a second event; and in response to detecting the occurrence of the second event, write data corresponding to the second event to the non-volatile memory of the storage device with the default SLC programming mode with a density of one data bit per memory cell using the default set of memory programming parameters.

13. The storage device of claim 12, wherein the one or more controller modules include:

an event occurrence detection module to detect occurrence of the first and the second events; and a data write module to write data to the non-volatile memory with the fast SLC programming mode in response to detecting the occurrence of the first event;

wherein the data write module is configured to write data corresponding to the second event to the non-volatile memory with the default SLC programming mode using the default set of memory programming parameters in response to detecting occurrence of the second event.

14. The storage device of claim 12, wherein writing data to the non-volatile memory of the storage device with the fast SLC programming mode takes at least 40% less time per predefined unit of data as compared to writing data to the non-volatile memory of the storage device with the default SLC programming mode.

15. The storage device of claim 12, wherein:

writing data with the fast SLC programming mode includes a memory programming operation comprising a plurality of electrical pulses, and the one or more memory programming parameters used for writing data with the fast SLC programming mode include one or more parameters selected from the group consisting of: a clock rate or programming pulse duration, a maximum number of electrical pulses used in the memory programming operation, a first electrical pulse or first set of electrical pulses of the plurality of electrical pulses, a write verification control parameter, and a delta voltage corresponding to a difference between a second voltage, for a second electrical pulse or second set of electrical pulses of the plurality of electrical pulses, and the first voltage.

16. The storage device of claim 15, wherein the clock rate or programming pulse duration used in the fast SLC programming mode is less than the clock rate or programming pulse duration used in the default SLC programming mode.

17. The storage device of claim 15, wherein the number of electrical pulses within the plurality of electrical pulses is lower than a default number of electrical pulses within a default plurality of electrical pulses.

18. A non-transitory computer-readable storage medium, storing one or more programs configured for execution by one or more processors of a storage device, the one or more programs including instructions that when executed by the one or more processors cause the storage device to:

detect occurrence of a first event;

in response to detecting the occurrence of the first event, write low read data to the non-volatile memory of the storage device, wherein low read data is data satisfying predefined low read criteria, wherein:

writing the low read data includes writing the low read data to the non-volatile memory of the storage device with a fast single-level cell (SLC) programming mode, distinct from a default SLC programming mode to the non-volatile memory of the storage device, writing data with the fast SLC programming mode includes writing the low read data with a density of one data bit per memory cell using one or more memory programming parameters distinct from a default set of memory programming parameters for writing data to the non-volatile memory of the storage device with the default SLC programming mode, and writing data to the non-volatile memory of the storage device with the fast SLC programming mode takes less time per predefined unit of data than writing data to the non-volatile memory of the storage device with the default SLC programming mode;

detect occurrence of a second event; and in response to detecting the occurrence of the second event, write data corresponding to the second event to the non-volatile memory of the storage device with the default SLC programming mode with a density of one data bit per memory cell using the default set of memory programming parameters.

19. The non-transitory computer-readable storage medium of claim 18, wherein the storage device includes a storage controller that includes the one or more processors, the one or more programs include one or more controller modules configured for execution by the one or more processors of the storage controller, and the one or more controller modules include:

an event occurrence detection module to detect occurrence of the first and the second events; and a data write module to write data to the non-volatile memory with the fast SLC programming mode in response to detecting the occurrence of the first event;

wherein the data write module is configured to write data corresponding to the second event to the non-volatile memory with the default SLC programming mode using the default set of memory programming parameters in response to detecting occurrence of the second event.

* * * * *